United States Patent
Li

(10) Patent No.: US 6,295,637 B1
(45) Date of Patent: Sep. 25, 2001

(54) SIMULATOR FOR THE POST-EXPOSURE BAKE OF CHEMICALLY AMPLIFIED RESISTS

(75) Inventor: Tsung-Lung Li, Hsinchu (TW)

(73) Assignee: Acer Semiconductor Manufacturing Inc., Hsinchu (TW)

( * ) Notice: Subject to any disclaimer, the term of this patent is extended or adjusted under 35 U.S.C. 154(b) by 0 days.

(21) Appl. No.: 09/189,612

(22) Filed: Nov. 9, 1998

(51) Int. Cl.[7] ............... G06F 17/10; G03C 1/494; H01L 21/44
(52) U.S. Cl. ............... 716/21; 716/19; 716/20; 430/270.1; 430/30; 703/13; 438/579
(58) Field of Search ............... 716/19–21; 430/30, 430/270.1; 703/13; 438/579, 167

(56) References Cited

U.S. PATENT DOCUMENTS

| | | | |
|---|---|---|---|
| 5,717,612 | 2/1998 | Capodieci | 716/21 |
| 5,889,676 | 3/1999 | Kubo et al. | 716/19 |
| 5,985,498 | 11/1999 | Levinson et al. | 430/30 |
| 5,999,720 | 12/1999 | Inui | 703/13 |
| 6,049,660 | 4/2000 | Ahn et al. | 703/13 |

OTHER PUBLICATIONS

Lee, et al, "Characteristics of 193 nm Chemically Amplified Resist during Post Exposure Bake and Post Exposure Delay", International Microprocesses and Nanotechnology Conference, 1999, pp. 92–93.

*Primary Examiner*—Matthew Smith
*Assistant Examiner*—Jibreel Speight

(57) ABSTRACT

A method of simulating a post-exposure bake (PEB) process for chemically amplified resists having photoacids and protection-sites comprises the following steps. First, the initial PEB parameters are input to represent a temperature-time history of the PEB process. Then, the reaction constants and a diffusion coefficient are input to represent the chemically amplified resists. Wherein the reaction constants are temperature-dependent, and the diffusion coefficient is temperature-dependent and protection-site-dependent in the entire course of the PEB simulation. The protection-site concentration of the chemically amplified resists is computed by using an implicit scheme, and the photoacid concentrations are computed in a space occupied by the chemically amplified resists based on the diffusion coefficient by using an implicit scheme.

22 Claims, 3 Drawing Sheets

SIMULATOR FOR THE POST-EXPOSURE BAKE OF CHEMICALLY AMPLIFIED RESISTS

FIELD OF THE INVENTION

The present invention relates to a simulator for the post-exposure bake process of chemically amplified resists used in the lithography of deep submicron device fabrication.

BACKGROUND OF THE INVENTION

Lithography in the deep submicron era employs photoresists of very different working principles from the previous generations. Because of the reduced power level of the light sources at the wavelength of Deep Ultra-Violet(DUV), the resists employing the principles of chemical amplifications are developed, and are called the Chemically Amplified Resists(CAR).

As the resist film is exposed to the DUV light, the latent image of photoacids conforming to the photomask patterns is produced in the resist. After exposure, the resist film is baked at elevated temperature for the protection polymers to react with the photoacids, and this process is called the Post-Exposure Bake(PEB).

In the PEB process, the protection polymers in the resist undergo a catalytic reaction with the photoacids, and are gradually annihilated for the case of positive CARs. At the end of the PEB process, the resist in the exposed area is, thus, deprotected, and has a much larger etch rate than in the unexposed area. Namely, as a result of the PEB process, the exposed portions of the photoresist become soluble and can be readily washed away by the developer.

At the elevated temperature of PEB, both the reaction mechanism of protection polymers and photoacids and the diffusion mechanism of photoacids occur. The PEB model which includes the coupling of the two mechanisms was published in the literature and was granted U.S. Pat. 5,717, 612 later (See, for example, L. Capodieci, A. Krasnoperova, F. Cerrina, C. Lyons, C. Spence, and K. Early, Novel post-exposure bake simulator: first results,"J. Vac. Sci. Technol., vol. B13, no. 6, pp. 2963–2967, 1995.). However, in the prior art, the reaction and diffusion mechanisms were modeled with fixed reaction constants and diffusion coefficient in the course of the bake process.

Because the reaction constants satisfy Arrhenius type of relations, the reaction rates have strong dependence on temperature. The temperature-time history, in turn, depends on the configurations of the bake apparatus and can be quite different between configurations. Hence, the reaction constants have to be modeled as time-dependent parameters in course of the PEB process.

Furthermore, the diffusion coefficient is reported to be dependent on both temperature and protection-site concentration.

Consequently, to physically model the PEB process, it is necessary to take into account the temperature-dependence and the protection-site-dependence of the reaction constants and the diffusion coefficient, and the temperature-time history of the bake apparatus.

SUMMARY OF THE INVENTION

Therefore, it is an object of the present invention to provide a method of simulating the post-exposure bake process of chemically-amplified resists which fulfills the following requirements:

(a) both the reaction mechanism of the protection polymers and the photoacids, and the diffusion mechanism of the photoacids are included, and are modeled by a set of reaction-diffusion equations;

(b) the reaction constant of the protection sites and the photoacids satisfy the Arrhenius expression;

(c) the acid-loss mechanism of the photoacids is modeled by a reaction with the reaction constant obeying the Arrhenius expression;

(d) the diffusion coefficient is expressed as the product of a temperature-dependent part and a part dependent on the protection-site concentration, wherein the temperature-dependent part also satisfies the Arrhenius expression; and the protection-site-dependent part satisfies an exponential expression;

(e) the temperature-time history is further given by a pair of exponential expression representing the heating and cooling phases of the bake apparatus.

(f) the above stated reaction constants and diffusion coefficient remain time-dependent in the entire course of PEB simulation.

The object is achieved in the present invention by providing a method of solving the set of reaction-diffusion equations with above stated conditions. The method comprises the steps of:

(g) discretizing the rectangular simulation area into equally spaced grids;

(h) computing the time stepsize based on a prescribed accuracy requirements;

(i) computing the protection-site concentration for the next time step, using the protection-site and photoacid concentrations of the current and the next time steps;

(j) computing the photoacid concentration in one direction for the intermediate time step in the middle of the current and the next time step;

(k) computing the photoacid concentration in the direction normal to the previous one for the next time step;

(l) repeating steps (i) to (k) until convergent solution is attained for the next time step;

(m) incrementing time step and repeating steps (h) to (1) until the end of the bake process.

The advantages of the present invention will be given in the detailed description of the preferred embodiments.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

Figure 1:
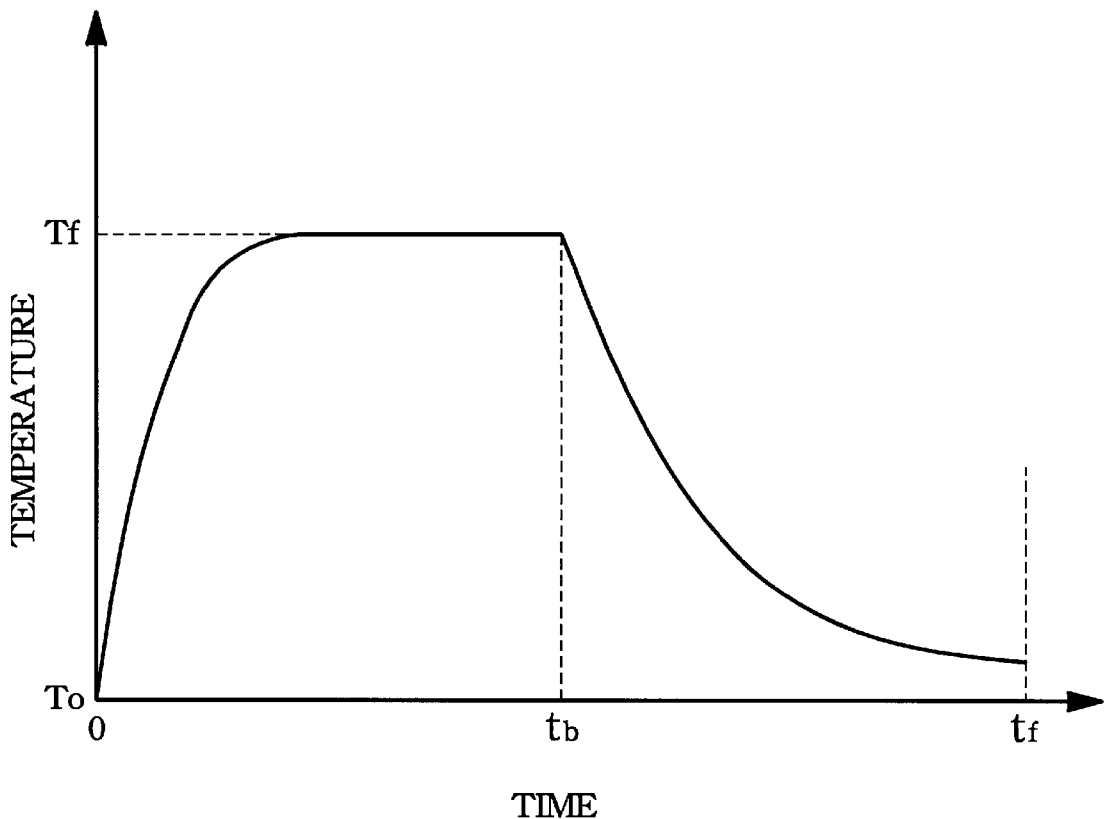
FIG. 1 is an example of the temperature-time history of a bake apparatus for performing the PEB process according to the present invention.

The four main constituents of chemically amplified resists are Photo-Acid Generators(PAG), protection polymers, resins and solvents. From the simulation point of view, the PAGs and the protection polymers play the major roles in the modeling of the PEB process.

At the exposure of a DUV beam, PAGs are decomposed into photoacids and by-products. The photoacids then react with the reactive sites of the protection polymers and produce secondary acids at the elevated temperature of PEB. For the case of positive resists, the reaction deprotects the resins, and is called the deprotection reaction. Hence, the protection polymers is also termed the inhibitors, and the reactive sites of the inhibitors are called the protection-sites.

Moreover, the photoacid diffusion is enhanced at elevated temperature. Hence, photoacid diffusion has to be included in the model.

The acids have to diffuse to the proper locations to react with the reactive sites of the protection polymers. In the course of diffusion, the acids may be trapped by the protection polymers, and are considered to be lost from the modeling point of view.

As a result, the deprotection reaction, the photoacid diffusion, and the acid-loss mechanism all have to be included in the PEB model, leading to a set of reaction-diffusion equations.

$$\frac{\partial M}{\partial t} = -k_D M H \quad (1)$$

$$\frac{\partial H}{\partial t} = \nabla \cdot (D_H \nabla H) + L_a \quad (2)$$

with the acid-loss term being $$L_a = -k_a H^2 \quad (3)$$

where M and H are the protection-site concentration and the acid concentration, respectively, and both are functions of time(t) and space(x). As indicated by Eq.(1), the deprotection reaction is modeled to be a first-order reaction of protection-sites and photoacids. Equation (2) shows that modeling of the photoacids includes a diffusion with the diffusion coefficient of $D_H$, and the acid-loss mechanism. The acid-loss mechanism is modeled by a second-order reaction of photoacids as illustrated in Eq. (3).

The preferred embodiment of this invention is a PEB simulator capable of modeling the effects of heating and cooling processes of a bake apparatus. This embodiment is realized by taking the deprotection reaction constant($k_D$), the acid-loss reaction constant(ka), and the diffusion coefficient($D_H$) to be time-dependent functions via the temperature-time history of the bake apparatus. To be specific, Arrhenius type of relations are utilized for the temperature-dependent part of the above mentioned constants and coefficient.

The reaction constants in Eqs. (1) and (3) are modeled by $$k_D = k_D(T) = A_D \exp(-E_D/kT) \quad (4)$$

and $$k_a = k_a(T) = A_a \exp(-E_a/kT) \quad (5)$$

where $A_D$ and $A_a$ are the pre-exponential constants and the $E_D$ and $E_a$ are activation energies, respectively, k is Boltzmann constant, and T is the temperature whose model will be given later.

The diffusion coefficient in Eq.(2) is modeled as a function of temperature and protection-site concentration, $$D_H = D_H(M, M_0, T) = D_0 \exp\left(\frac{\alpha x}{1 + \beta x}\right) \quad (6)$$

with $$x = 1 - M/M_0 \quad (7)$$

and $$D_0 = D_0(T) = A_0 \exp(-E_0/kT) \quad (8)$$

wherein the diffusion coefficient $D_H$ comprises of a temperature-dependent part and a concentration-dependent part, the temperature-dependent part is $D_0$ as illustrated in Eq.(6), the concentration-dependent part is the exponential part of Eq.(6). $M_0$ is the initial concentration of the protection-sites. $A_0$ and $E_0$ are, respectively, the pre-exponential constant and the activation energy of the temperature-dependent part of the diffusion coefficient $D_H$. $\alpha$ and $\beta$ are model parameters of the concentration-dependent part of the diffusion coefficient $D_H$.

Referring to FIG. 1, the temperature ramping of a bake apparatus is modeled to be exponential functions of time, wherein the temperature-time history comprises a heating phase from beginning to the bake time $t_b$, and a cooling phase from the bake time $t_b$ to the final time $t_f$, the final time $t_f$ here of is chosen to ensure the temperature is sufficiently close to the room temperature,$T_0$. The temperature model is, thus, formulated by $$T = T(t) = \begin{cases} \Delta T(1 - e^{-t/\tau_h}) + T_0 & \text{if } 0 \leq t \leq t_b \\ \Delta T' e^{-(t-t_b)/\tau_c} + T_0 & \text{if } t_b < t \end{cases} \quad (9)$$

with $$\Delta T = T_f - T_0 \quad (10)$$

and $$\Delta T' = T'_f - T_0 \quad (11)$$

where $T_0$ and $T_f$ are the room and bake temperatures, respectively, $\tau_h$ and $\tau_c$ are the time constants of the heating and cooling phases of the bake process, respectively, and the bake time is denoted by $t_b$. To ensure the continuity of temperature at $t_b$, $T'_f$ is given by $$T'_f = \Delta T(1 - e^{-t_b/\tau_h}) + T_0 \quad (12)$$

The inclusion of the protection-site-dependent diffusion coefficient in the resist model as shown in Eq. (6) makes the PEB simulator more authentic.

Figure 2:
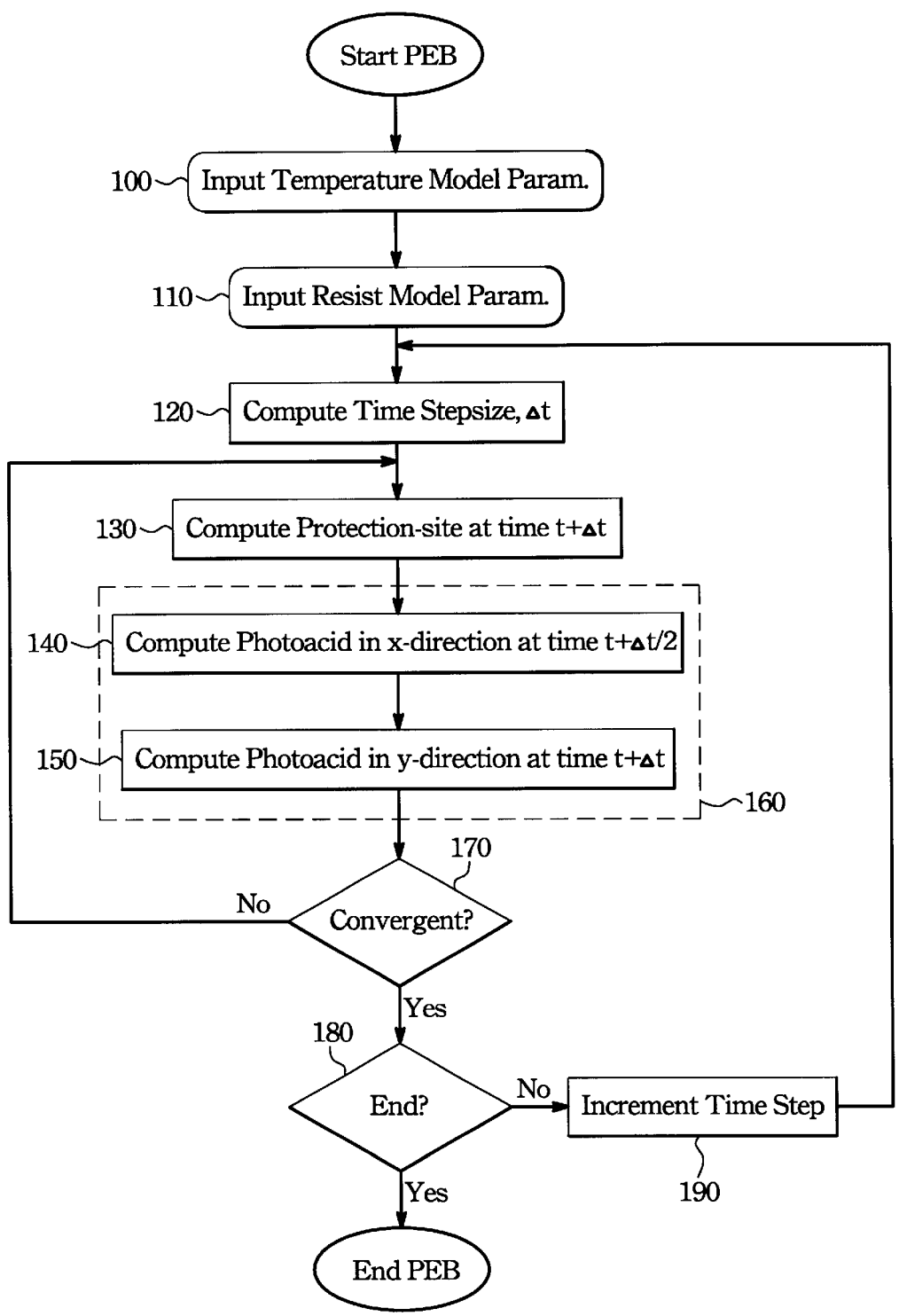
FIG. 2 is the flow chart of the numerical algorithm employed to solve the modeling equations of the post-exposure bake process.
Figure 3:
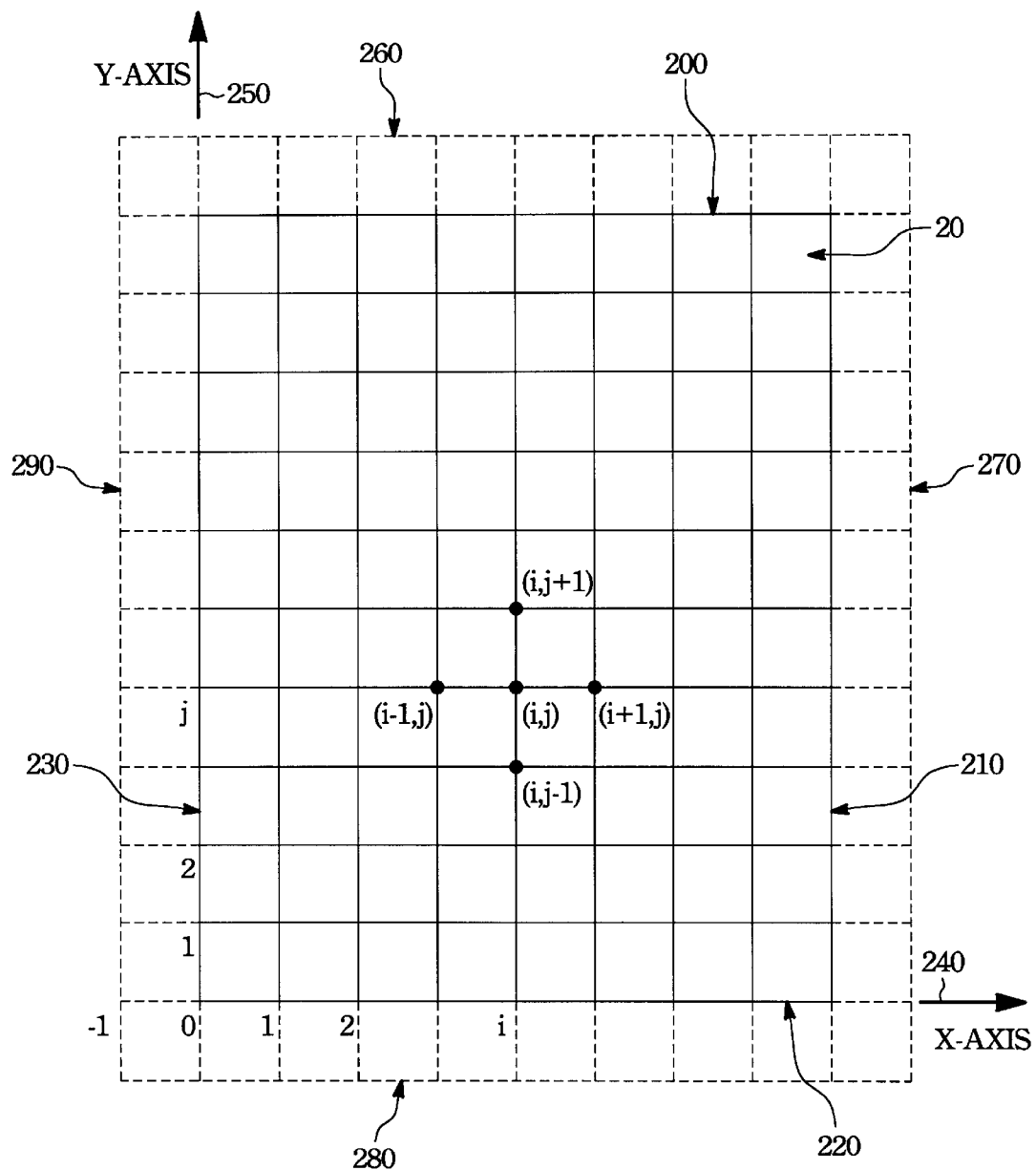
FIG. 3 is an illustration for the meshes utilized by the numerical scheme.

The numerical scheme to solve the above mentioned PEB model using the algorithm given in FIG. 2 and the meshes depicted in FIG. 3 is to be explained below.

The resist is physically located in the area bounded by the solid lines, 200, 210, 220 and 230, of FIG. 3. The solid lines 200 and 220 are the resist-atmosphere and the resist-substrate interfaces, respectively. Hence, the x-axis 240 is along the substrate surface; and the y-axis 250 is along the thickness of the resist film. The entire solution area 20 is discretized into equally spaced grids.

The boundary conditions are approximated by using the central difference method. For example, the first-order derivative of the acid concentration on boundary 230 is approximated by $$\left.\frac{\partial H}{\partial x}\right|_{(0,j)} \approx \frac{H_{1,j} - H_{-1,j}}{2\Delta x} \quad (13)$$

for j=0 to N, where $\Delta x$ is the mesh size in the x-direction. As a result, meshes of the PEB simulation have to be extended to the border enclosed by the dashed lines, 260, 270, 280 and 290, as shown in FIG. 3.

The Iterative Alternating Direction Implicit(IADI) method is used to solve the set of reaction-diffusion equations in Eqs. (1) to (3). The numerical scheme is illustrated in FIG. 2. The detailed steps and the advantages will be explained in the following paragraphs.

First, performing the step 100, the parameters modeling the temperature-time history of the bake apparatus are input to the simulator. These parameters include the room and bake temperatures, $T_0$ and $T_p$, the bake time $t_b$, and the time constants $\tau_h$ and $\tau_c$ as defined in Eqs. (9) to (12).

Then, performing the step 110, the physical parameters of the resists are input to the simulator. These parameters include the pre-exponential constants $A_0$, $A_D$ and $A_a$, the activation energies $E_0$, $E_D$ and $E_a$, and $\alpha$- and $\beta$-parameters defined in Eqs. (4) to (8).

In step 120, the time stepsize $\Delta t \equiv t_{n+1} - t_n$, is computed by requiring the relative errors averaged over all nodal points of grids shown in FIG. 3 be less than a small positive number prescribed in advance.

In step 130, the concentration of the protection-sites is computed for the next time step n+1, namely, at time t+$\Delta$t, using an implicit scheme. The computation of the protection-site concentration for the next time step n+1 at grid (i, j) needs information of the current time step n as well as the next time step n+1 at the same grid point. Hence, iteration is required to conclude the advancement of a time step.

In step 140, the intermediate photoacid concentration is computed at a half time step n+½, namely, at time t+$\Delta$t/2, in the x-direction, using an implicit scheme. The computation of the photoacid concentration H for the intermediate time step n+½ at grid (i, j) needs the information (a) and (b), wherein the information (a) is the photoacid concentration H of the current time step n at three neighboring grids: (i, j−1), (i, j) and (i, j+1), and the information (b) is the diffusion coefficients $D_H$ at the current and the intermediate time step. Since the protection-site concentration is calculated in step 130 for the next time step, the diffusion coefficients at the intermediate time step are computed using the protection-site concentration averaged over the current and the next time steps.

In step 150, the photoacid concentration is computed at an integral time step n+1, namely, at time t+$\Delta$t, in the y-direction, using an implicit scheme. The computation of the photoacid concentration for the next time step n+1 at grid (i,j) needs the information (c) and (d), wherein the information (c) is the photoacid concentration of the intermediate time step n+½ at three neighboring grids: (i−1, j),(i, j) and (i+1, j), and the information (d) is the diffusion coefficients at the intermediate and the next time steps. The diffusion coefficients at the intermediate time step are computed using the averaged protection-site concentration.

As indicated by the dashed box 160, the combination of steps 140 and 150 concludes the computation of photoacid concentrations at the next time step n+1.

Steps 130 to 150 constitute an iteration of the computation for the next time steps. The convergence condition is checked at step 170. If the computation is not convergent, iteration is repeated with the updated protection-site and photoacid concentrations until the convergence condition is satisfied. Then, the computation to advance from the current to the next time steps is concluded.

After the convergence of a time step is reached, the end-of-bake condition is examined at step 180. If the end of bake is reached, the PEB simulation is completed. Otherwise, the time step is incremented at step 190, and the program control is directed to step 120 for a new time step.

The numerical scheme given in FIG. 2 comprises, at least, three advantages:

(1) In the entire course of the PEB simulation, the values of all reaction constants($k_D$ and $k_a$) and the value of the photoacid diffusion coefficient ($D_H$) are evaluated for each individual time step, half or integral. Simulation of the temperature-time history of the PEB process becomes attainable.

(2) in the entire course of the PEB simulation, the value of the photoacid diffusion coefficient ($D_H$) is evaluated at each spatial grid point, half or integral. This facilitates the simulation of the PEB process with protection-site-dependent photoacid diffusion coefficient ($D_H$).

(3) In the numerical scheme, the protection-site concentration of the next time step is computed before the photoacid concentration. Hence, the computed protection-site concentration can be utilized in the subsequent computation of the diffusion coefficient appearing in the diffusion equation of the photoacids. By this means, the convergence of the numerical scheme is expedited.

As is understood by a person skilled in the art, the foregoing preferred embodiment of the present invention is illustration of the present invention rather than limiting of the present invention. It is intended to cover various modifications and similar arrangements included within the spirit and scope of the appended claims, the scope of which should be accorded the broadest interpretation so as to encompass all such modifications and similar structure.

While the preferred embodiment of the invention has been illustrated and described, it will be appreciated that various changes can be made therein without departing from the spirit and scope of the invention.

What is claimed:

1. A method of simulating a post-exposure bake (PEB) process for chemically amplified resists having photoacids and protection-sites, the method comprising the steps of:

initializing initial PEB parameters representing a temperature-time history of said PEB process;

initializing reaction constants and a diffusion coefficient representing said constants being temperature-dependent, and said diffusion coefficient being temperature-dependent and protection-site-dependent;

computing protection-site concentration of said chemically amplified resists by using an implicit scheme; and computing photoacid concentrations in a space occupied by said chemically amplified resists based on said diffusion coefficient by using said implicit scheme, wherein said PEB process comprises of a heating stage and a cooling stage, and said heating stage and cooling stage are both represented by exponential functions.

2. The method of claim 1, wherein said initial PEB parameters comprise of a room temperature, a bake temperature, a bake time, and time constants for said exponential functions.

3. The method of claim 1, wherein said step of initializing reaction constants and a diffusion coefficient for representing said chemically amplified resists further comprises the steps of:

expressing said temperature-dependence of said reaction constants and diffusion coefficient by Arrhenius relations; and expressing said protection-site-dependence of said diffusion coefficient by an exponential expression.

4. The method of claim 3, wherein said reaction constants comprise of pre-exponential constants and activation energies; and said diffusion coefficient comprises of model parameters of said protection-site-dependence for said diffusion coefficient.

5. The method of claim 1, wherein said PEB process is divided into a plurality of time intervals, and said steps of computing protection-site concentration and computing photoacids concentrations are performed for each of said time intervals.

6. The method of claim 5, wherein said step of computing protection-site concentration further comprises the steps of:
(a) computing sizes of said time intervals based on a prescribed error tolerance;
(b) computing said protection-site concentration for next time interval by using a trapezoidal method.

7. The method of claim 6, wherein said step of computing photoacid concentration further comprises the steps of:
(c) computing said photoacid concentration in first direction for a intermediate time interval at a middle of current and said next time intervals;
(d) computing said photoacid concentration in second direction perpendicular to said first direction for said next time interval;
(e) repeating said steps (b) to (d) until convergent solution being attained for the next time interval.

8. The method of claim 7, further comprises a step of incrementing a time interval and repeating said steps (a) to (e) until a end of said PEB process.

9. The method of claim 6, wherein said protection-site concentration of said next time interval at said step (b) is expressed in terms of said photoacid and said protection-site concentrations of said current and said next time intervals.

10. The method of claim 8, wherein said photoacid concentration at steps (c) and (d) is calculated by using said protection-site-dependent diffusion coefficient; and said protection-site concentration evaluated at step (b) is utilized for said intermediate and said next time steps.

11. An apparatus for simulating a PEB process for a chemically amplified photoresist the apparatus comprising:
first means for selecting initial PEB parameters to represent a temperature-time history of said PEB process;
second means responsive to said first means for determining reaction constants and a diffusion coefficient by using said temperature-time history to represent said chemically amplified resists, wherein said reaction constants being temperature-dependent, and said diffusion coefficient being temperature-dependent and protection-site-dependent;
third means responsive to said second means for computing protection-site concentration of said chemically amplified resists by using an implicit scheme based on said distribution of said protection-site; and
fourth means responsive to said third means for computing photoacid concentrations in a space occupied by said chemically amplified resists based on said diffusion coefficient by using said implicit scheme, wherein said PEB process comprises of a heating stage and a cooling stage, and said heating stage and cooling stage are both represented by exponential functions.

12. The apparatus of claim 11, wherein said initial PEB parameters comprise of a room temperature, a bake temperature, a bake time, and time constants for said exponential functions.

13. The apparatus of claim 11, wherein said temperature-dependence of said reaction constants and diffusion coefficient are both expressed by Arrhenius relations.

14. The apparatus of claim 11, wherein said protection-site-dependence of said diffusion coefficient is expressed by an exponential expression.

15. The apparatus of claim 14, wherein said photoacid concentration is calculated by using said protection-site-dependent diffusion coefficient.

16. The apparatus of claim 11, wherein said PEB process is divided into a plurality of time intervals, and said protection-site concentration and photoacid concentrations being computed for each of said time intervals.

17. The apparatus of claim 16, wherein said protection-site concentration evaluated by said third means is utilized for computing said photoacid concentrations by said fourth means.

18. The apparatus of claim 16, wherein said protection-site concentration for next time interval is performed by using a trapezoidal method.

19. The apparatus of claim 18, wherein said photoacid concentrations in first direction are performed for a intermediate time interval at a middle of current and said next time intervals.

20. The apparatus of claim 19, wherein said photoacid concentrations in second direction perpendicular to said first direction are performed for said next time interval.

21. The apparatus of claim 20, wherein said apparatus further comprises fifth means responsive to said fourth means for determining said photoacid concentrations being convergent solutions for the next time interval, and said third means is responsive to said fifth means to compute said protection-site concentration again whenever said photoacid concentration being not convergent.

22. The apparatus of claim 20, wherein said protection-site concentration at said next time interval computed by said third means is expressed in terms of said photoacid and said protection-site concentrations for said current and said next time interval.

* * * * *